(12) United States Patent
Fukushima

(10) Patent No.: US 6,967,527 B2
(45) Date of Patent: Nov. 22, 2005

(54) PULSE WIDTH MODULATION AMPLIFIER

(75) Inventor: Mitsugi Fukushima, Tokyo (JP)

(73) Assignee: Denon, Ltd., Tokyo (JP)

( * ) Notice: Subject to any disclaimer, the term of this patent is extended or adjusted under 35 U.S.C. 154(b) by 0 days.

(21) Appl. No.: 10/669,209

(22) Filed: Sep. 25, 2003

(65) Prior Publication Data

US 2004/0160271 A1 Aug. 19, 2004

(30) Foreign Application Priority Data

Feb. 17, 2003  (JP) ..................... 2003-038735

(51) Int. Cl.[7] .............................................. H03F 3/38
(52) U.S. Cl. ........................................ 330/10; 330/251
(58) Field of Search .................... 330/10, 251, 207 A, 330/146

(56) References Cited

U.S. PATENT DOCUMENTS

| | | | | |
|---|---|---|---|---|
| 5,612,646 A | * | 3/1997 | Berning ....................... | 330/10 |
| 6,175,272 B1 | | 1/2001 | Takita | |
| 6,211,728 B1 | * | 4/2001 | Chen et al. ................... | 330/10 |
| 6,294,954 B1 | * | 9/2001 | Melanson ..................... | 330/10 |
| 6,313,697 B1 | * | 11/2001 | Neuteboom et al. ........... | 330/10 |
| 6,388,514 B1 | * | 5/2002 | King et al. ................... | 330/10 |
| 2002/0135419 A1 | | 9/2002 | Groves, Jr. et al. | |

FOREIGN PATENT DOCUMENTS

| | | |
|---|---|---|
| JP | 52-96854 | 8/1977 |
| JP | 61-39708 | 2/1986 |
| JP | 3-159409 | 7/1991 |
| WO | WO 00/28658 | 5/2000 |

OTHER PUBLICATIONS

Patent Abstracts of Japan, vol. 0153, No. 94 (E–1119), Oct. 7, 1991 and JP 3 159409 A, Jul. 9, 1991.
Patent Abstracts of Japan, vol. 0011, No. 55 (E–073), Dec. 12, 1977 and JP 52 096854 A, Aug. 15, 1977.
Patent Abstracts of Japan, vol. 0101, No. 97 (E–418), Jul. 10, 1986 and JP 61 039708 A, Feb. 25, 1986.

* cited by examiner

Primary Examiner—Henry Choe
(74) Attorney, Agent, or Firm—Dickstein Shapiro Morin & Oshinsky LLP

(57) ABSTRACT

An object of the present invention is to provide a pulse width modulation amplifier which is capable of suppressing an output distortion due to a power voltage regulation, without deteriorating efficiency. The pulse width modulation amplifier relating to the present invention includes, a first series circuit including a first switching element 41 connected to a positive pole side of a first direct-current power source Vcc1, and a second switching element 42, one end of the load circuit being connected to a connecting point between the first switching element 41 and the second switching element 42, a second series circuit including a third switching element 51 connected to a positive pole side of a second direct-current power source Vcc2, and a fourth switching element 52, the other end of the load circuit being connected to a connecting point between the third switching element 51 and the fourth switching element 52, and a driving circuit which turns on a set of the first switching element 41 and the fourth switching element 52, and a set of the second switching element 42 and the third switching element 51 set-by-set, so that each of the sets is alternately put into on-state.

2 Claims, 4 Drawing Sheets

Prior Art

Prior Art

PULSE WIDTH MODULATION AMPLIFIER

DESCRIPTION OF THE RELATED ART

The present invention relates to a pulse width modulation amplifier, in particular, it relates to a pulse width modulation amplifier which is capable of suppressing an output distortion.

Recently, a Class D amplifier such as PWM (Pulse Width Modulation) amplifier attracts attention from a viewpoint of lower power consumption, since in the Class D amplifier, a loss in an output stage is smaller comparing to a Class A amplifier and a Class B amplifier.

FIG. 6 is a block diagram showing the output stage of a pulse width modulation amplifier according to earlier development. "Vcc" represents a direct-current power source. Reference numbers 31, 32, 33 and 34 respectively indicate a first switching element, a second switching element, a third switching element and a fourth switching element. These switching elements 31, 32, 33 and 34 constitute a bridge circuit. Reference numbers 5 and 6 indicate low pass filters for filtering a noise, and reference number 7 indicates a loud speaker as a load on the bridge circuit.

FIG. 7 is a waveform chart showing operations of each part of the pulse width modulation amplifier as shown in FIG. 6. Here, "D" indicates a driving signal which is supplied to the first and the fourth switching elements 31 and 34, and "−D" (inversion signal of "D") indicates a driving signal which is supplied to the second and the third switching elements 32, 33. "Vsp" indicates a voltage to be applied to the loud speaker 7, and "isp" indicates a loud speaker current.

FIG. 8 is an overall block diagram of the pulse width modulation amplifier as shown in FIG. 6.

Reference number 21 indicates an input section to which audio data is inputted from a reproducing unit such as a CD (Compact Disc) player, for example. Reference number 22 indicates a digital filter by which the audio data is subjected to a computing process such as tone control, and low-pass filtering. Reference number 23 indicates a PWM generating section which generates the driving signals D and −D for driving the switching elements 31, 32, 33 and 34. Reference number 24 indicates an output stage corresponding to the bridge circuit comprising the first to the fourth switching elements 31, 32, 33 and 34.

The PWM generating section 23 compares the audio data and a triangular wave, for example, and generates the driving signals D and −D based on the comparison result. When the driving signal D becomes level "H", which is supplied by the PWM generating section 23 to the switching elements 31, 34, the switching elements 31, 34 are turned "ON", and a forward voltage α is applied to the loud speaker 7 (see FIG. 7). Similarly, when the driving signal −D becomes level "H", which is supplied by the PWM generating section 23 to the switching elements 32, 33, the switching elements 32, 33 are turned "ON", and a reverse voltage β is applied to the loud speaker 7. Therefore, as shown in the left portion of the waveform of "vsp" in FIG. 7, during "T1", i.e., a time period when the forward voltage α is applied to the loud speaker 7 is longer than the time period when the reverse voltage β is applied, the loud speaker is forward-driven. On the other hand, during "T2", i.e., a time period when the forward voltage α is applied to the loud speaker 7 is shorter than the time period when the reverse voltage β is applied, the loud speaker 7 is reverse-driven.

In the meantime, the output from the pulse width modulation amplifier is determined by a pulse width of the driving signal and amplitude of the power supply voltage. Therefore, in order to obtain an amplifier output without any distortion, the output stage of the pulse width modulation amplifier needs a supply of driving signals D, −D, each having a precise pulse width, and a power supply voltage with a limited voltage regulation.

A technique to suppress a distortion in output from an amplifier, due to a regulation in the power supply voltage, is described in the Japanese Patent Applications Laid-open No. S52-96854, No. S61-39708, and No. H03-159409.

According to the amplifier disclosed in the Japanese Patent Application Laid-open No. S52-96854, a distortion in the output from the amplifier due to the regulation in the power supply voltage can be removed, by adding a constant voltage diode within a D class amplifier, since the constant voltage diode is capable of generating a reference voltage which gives a constant voltage function to a transistor as a switching element.

According to the amplifier disclosed in the Japanese Patent Applications Laid-open No. S61-39708 and No. H03-159409, a distortion in the output from the amplifier due to a regulation in a power supply voltage can be removed, by correcting a pulse width of a driving signal according to a detected result as to the power supply voltage regulation.

SUMMARY OF THE INVENTION

The present inventor finds, according to the amplifier disclosed in Japanese patent applications Laid-Open No. S52-96854, when it is required to handle a high-power output, a loss due to the transistor in the output stage is increased, and then efficiency may be deteriorated.

And the present inventor finds, according to the amplifier disclosed in Japanese patent application Laid-Open No. S61-39708 and No. H03-159409, the pulse width correcting lags behind the detection of the power supply voltage regulation, the distortion in the output from the amplifier may not be sufficiently removed.

In view of the problems as described above, an object of the present invention is to suppress a distortion in an output from a pulse width modulation amplifier, due to a regulation in a power supply voltage, without deteriorating efficiency. In order to achieve the object, the present invention provides a pulse width modulation amplifier which supplies to a load circuit an amplified output having been subjected to a pulse width modulation, comprising:

a first series circuit including a first switching element connected to a positive pole side of a first direct-current power source, and a second switching element, one end of the load circuit being connected to a connecting point between the first switching element and the second switching element, a second series circuit including a third switching element connected to a positive pole side of a second direct-current power source, and a fourth switching element, the other end of the load circuit being connected to a connecting point between the third switching element and the fourth switching element, and a driving circuit which turns on a set of the first switching element and the fourth switching element, and a set of the second switching element and the third switching element, set-by-set, each of the sets being alternately put into on-state.

DESCRIPTION OF THE PREFERRED EMBODIMENTS

Hereinafter, preferred embodiments of the present invention will be explained with reference to the attached drawings.

Figure 1:
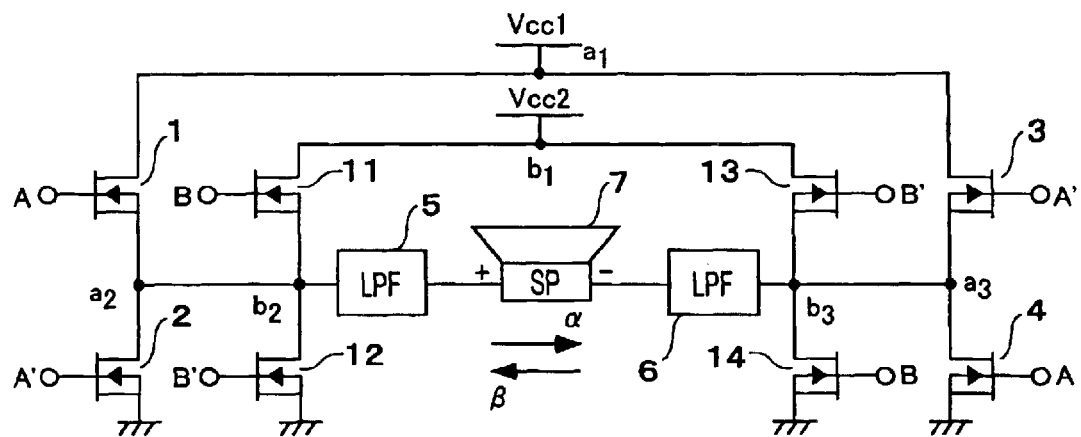
FIG. 1 is a circuitry diagram of an output stage of a pulse width modulation amplifier relating to an embodiment of the present invention.

FIG. 1 is a circuitry diagram of an output stage of a pulse width modulation amplifier relating to the present embodiment.

In FIG. 1, "Vcc1" represents a direct-current power source. Reference numbers 1, 2, 3 and 4 respectively indicate four switching elements constituting the first full-bridge circuit, namely, the first switching element 1, the second switching element 2, the third switching element 3 and the fourth switching element 4. Each of the switching elements 1, 2, 3 and 4 is configured, for example, by FET (Field Effect Transistor). Reference numbers 5 and 6 indicate low pass filters for filtering a noise and reference number 7 indicate a loud speaker as a load on the first full-bridge circuit.

"Vcc2" represents a second direct-current power source. The reference numbers 11, 12, 13 and 14 respectively indicate four switching elements constituting the second full-bridge circuit, namely, the fifth switching element 11, the sixth switching element 12, the seventh switching element 13 and the eighth switching element 14. Each of the switching elements 11, 12, 13 and 14 is configured, for example, by FET (Field Effect Transistor).

The loud speaker 7 and the low pass filters 5, 6 bridge a pair of opposing connecting points "a2" and "a3" of the first full-bridge circuit. Here, a2 is a connecting point between the first and the second switching elements 1, 2, and a3 is a connecting point between the third and the fourth switching elements 3, 4. Simultaneously, the loud speaker 7 and the low pass filters 5, 6 bridge another pair of opposing connecting points b2 and b3 of the second full-bridge circuit. Here b2 is a connecting point between the fifth and the sixth switching elements 11, 12 and b3 is a connecting point between the seventh and the eighth switching elements 13, 14. In other words, the loud speaker 7 and the low pass filters 5, 6 for filtering noise are connected as common load circuit to the first and the second full-bridge circuits. Therefore, the first full-bridge circuit and the second full-bridge circuit have a similar configuration, being provided with a common load circuit.

Figure 2:
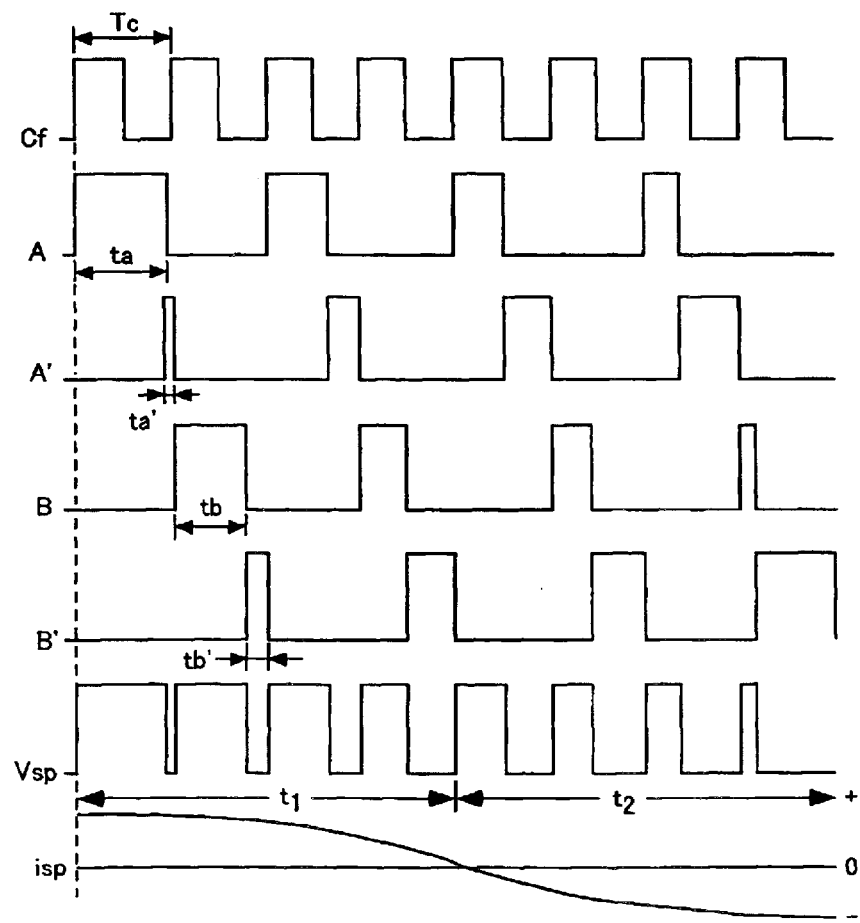
FIG. 2 is a waveform chart showing operations of each part of the pulse width modulation amplifier relating to an embodiment of the present invention.

FIG. 2 is a waveform chart showing operations of each part of the pulse width modulation amplifier of the present embodiment.

"Cf" indicates a carrier signal as a control reference, "A" indicates a driving signal supplied to the first and the fourth switching elements 1, 4 of the first full-bridge circuit, and "A'" indicates a driving signal supplied to the second and the third switching elements 2, 3 of the first full-bridge circuit. Here, an active period "ta+ta'" of the driving signals A, A' is set to be approximately equal to the cycle "Tc" of the carrier signal Cf. The active period ta+ta' represents a sum of the driving period "ta" of the driving signal A and the driving period "ta'" of the driving signal A'.

"B" indicates a driving signal supplied to the fifth and the eighth switching elements 11, 14 of the second full-bridge circuit, and "B'" indicates a driving signal supplied to the sixth and the seventh switching elements 12, 13 of the second full-bridge circuit. Here, an active period "tb+tb'" of the driving signals B, B' is set to be approximately equal to the cycle "Tc" of the carrier signal Cf. The active period tb+tb' represents a sum of the driving period "tb" of the driving signal B and the driving period "tb'" of the driving signal B'.

"Vsp" indicates a voltage applied to the loud speaker 7 and "isp" indicates a loud speaker current.

Figure 3:
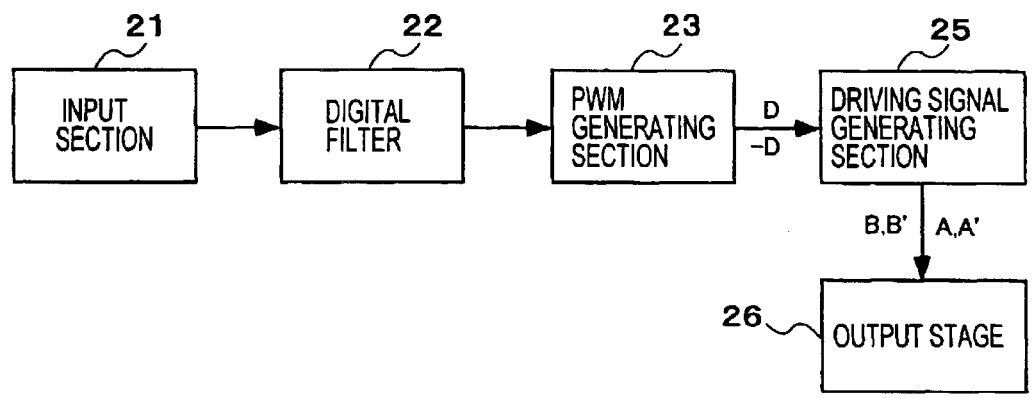
FIG. 3 is a block diagram of the pulse width modulation amplifier relating to an embodiment of the present invention.

FIG. 3 is an overall block diagram of the pulse width modulation amplifier relating to the present embodiment.

Figure 8:
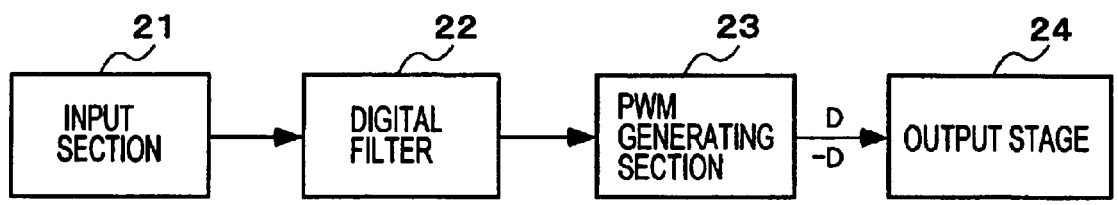
FIG. 8 is an overall block diagram of the pulse width modulation amplifier according to earlier development.

As shown in FIG. 3, the pulse width modulation amplifier includes an input section 21, a digital filter 22, a driving circuit (a PWM generating section 23, a driving signal generating section 25), and an output stage 26, and other things. It is to be noted since the configuration having a same reference number used commonly in FIG. 3 and FIG. 8 carries out a same function, explanation thereof will be omitted.

The driving signal generating section 25 generates driving signals A, A', B, and B' based on the driving signals D, −D, which have been generated in the PWM generating section 23. Here, the driving signal A is to be supplied to the first and the fourth switching elements 1, 4 of the first full-bridge circuit, the driving signal A' is to be supplied to the second and the third switching elements 2, 3 of the first full-bridge circuit, the driving signal B is to be supplied to the fifth and the eighth switching elements 11, 14 of the second full-bridge circuit, and the driving signal B' is to be supplied to the sixth and the seventh switching elements 12, 13 of the second full-bridge circuit.

The output stage 26 is configured by a parallel circuit including the first full-bridge circuit connected to the first direct-current power source Vcc1, and the second full-bridge circuit connected to the second direct-current power source Vcc2.

Figure 4:
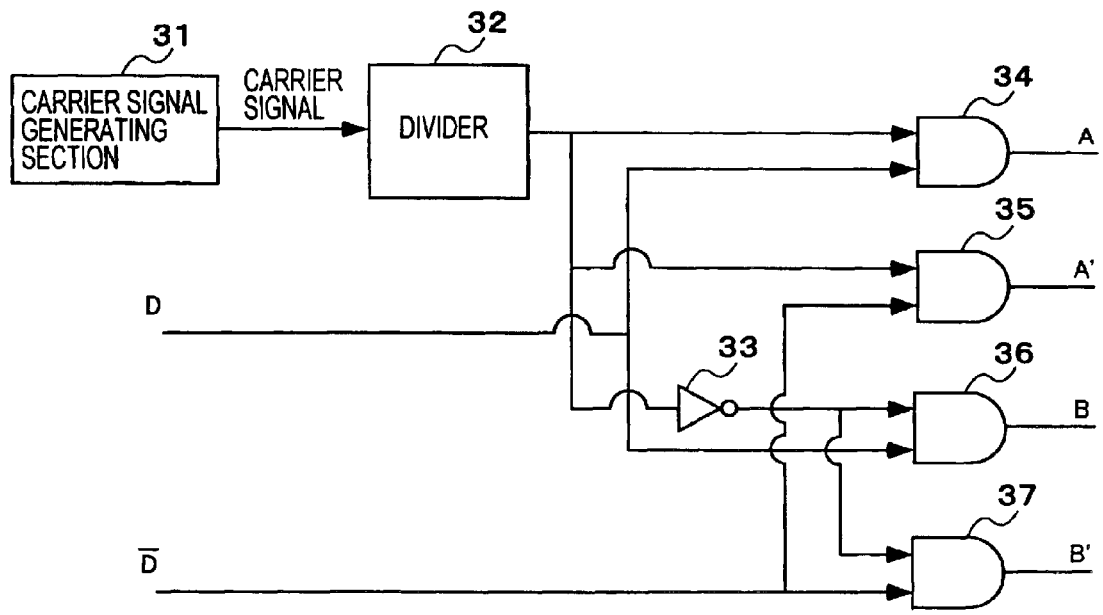
FIG. 4 is a block diagram of the driving signal generating section which is shown in FIG. 3.

FIG. 4 is an illustration for explaining the details of the driving signal generating section 25 of FIG. 3.

As shown in FIG. 4, the driving signal generating section 25 includes a carrier signal generating section 31 which generates a carrier signal Cf, a divider 32 which divides the carrier signal Cf, for example, in half, a NOT circuit 33, and AND circuits 34, 35, 36 and 37.

When audio data is inputted into the input section 21, the audio data is subjected to a computing process such as tone control and low pass filtering by the digital filter 22. Subsequently, in the PWM generating section 23, driving signals D, −D are generated based on a comparison result between the audio data and a triangular wave, and thus generated driving signals D, –D are inputted into the driving signal generating section 25. In the driving signal generating section 25, the logical AND between the driving signals D, –D from the PWM generating section 23 and an output from the divider 32 is carried out, whereby the driving signals A, A' are generated. Further, the logical AND between the driving signals D, –D from the PWM generating section 23 and an output from the NOT circuit 33 is carried out, whereby the driving signals B, B' are generated. Those driving signals A, A', B and B' thus obtained are respectively supplied to predetermined switching elements in the first and the second full-bridge circuits. Specifically, the driving signal A is supplied to the first and the fourth switching elements 1, 4 in the first full-bridge circuit, the driving signal A' is supplied to the second and the third switching elements 2, 3 in the first full-bridge circuit, the driving signal B is supplied to the fifth and the eighth switching elements 11, 14 in the second full-bridge circuit, and the driving signal B' is supplied to the sixth and the seventh switching elements 12, 13 in the second full-bridge circuit. In the first full-bridge circuit, the driving signal A which is supplied to the first and the fourth switching elements 1, 4, or the driving signal A' which is supplied to the second and the third switching elements 2, 3 becomes level "H", a connection is established between the first direct-current power source Vcc1 and the loud speaker 7, to supply the forward voltage α or the reverse voltage β with respect to the loud speaker 7. Similarly, in the second full-bridge circuit, the driving signal B which is supplied to the fifth and the eighth switching elements 11, 14, or the driving signal B' which is supplied to the sixth and the seventh switching elements 12, 13 becomes level "H", a connection is established between the second direct-current power source Vcc2 and the loud speaker 7 to supply the forward voltage α or the reverse voltage β to the loud speaker 7.

As shown in FIG. 2, the driving signals A, A' and the driving signals B, B' are alternately activated every cycle of the carrier signal Cf. Therefore, each of two sets of the switching elements, constituting one full-bridge circuit is alternately put into on-state for one time, while another two sets of switching elements constituting the other full-bridge circuit are in off-state. Here, two sets indicate a set of the first and the fourth switching elements and a set of the second and the third switching elements for the first full-bridge circuit, or a set of the fifth and the eighth switching elements and a set of the sixth and the seventh switching elements for the second full-bridge circuit. In other words, as known from the waveforms of the driving signals A, A', B and B' in FIG. 2, when the fifth to eights switching elements 11, 12, 13 and 14 of the second full-bridge circuit are in off-state, each of two sets of the switching elements in the first full-bridge circuit (a set of the first and the fourth switching elements 1, 4 and a set of the second and the third switching elements 2, 3) is alternately put into on-state for one time. Subsequently, when the first to fourth switching elements 1, 2, 3 and 4 of the first full-bridge circuit are in off-state, each of the two sets of the switching elements in the second full-bridge circuit (a set of the fifth and the eighth switching elements 11, 14 and a set of the sixth and the seventh switching elements 12, 13) is alternately put into on-state for one time. Here, in the second full-bridge circuit, the set of switching elements 11, 14 is put into on-state in advance, which has a same positional relationship with the set of switching elements 1, 4, with respect to the loud speaker 7, the set of switching elements 1, 4 being also put into on-state in advance among the two sets of the switching elements of the first full-bridge circuit. Accordingly, the two full-bridge circuits are alternately activated.

With the operations as described above, the power source current is supplied to the load circuit alternately from the first direct-current power source Vcc1 and the second direct-current power source Vcc2. Therefore, comparing to the case where only one full-bridge circuit is employed in the output stage, the period when the power is applied from each of the direct-current power source Vcc1, Vcc2 is made one-half. Even in this state, since the output voltages generated by the two full-bridge circuits are synthesized at the both edges of the loud speaker 7, as shown in FIG. 2, the applied voltage Vsp of the loud speaker 7 has a waveform similar to that of the case where a pulse width modulation amplifier according to earlier development is employed. Then, as in the case being connected to the pulse width modulation amplifier according earlier development, the loud speaker 7 is forward-driven during the period t1 when the application period of the forward voltage α is longer than the application period of the reverse voltage β, whereas it is reverse-driven during the period t2 when the application period of the forward voltage α is shorter than the application period of the reverse voltage β.

As described above, according to the present embodiment, since two full-bridge circuits are alternately activated, the power supply current is supplied to a load circuit alternately from the first direct-current power source Vcc1 and the second direct-current power source Vcc2. Therefore, even if the output voltage of one direct-current power source is lowered due to a supply of a power source current, it can restore the output voltage, during the time when the other direct-current power source is supplying the power source current. For example, even after a flow of a load current in large volume, it is possible to secure a time to restore the voltage drop. Consequently, though a constant voltage diode is not employed for providing a transistor in the output stage with a constant voltage function, it is possible to prevent an occurrence of amplifier output distortion. In other words, the distortion of the amplifier output due to a regulation in the power supply voltage can be suppressed without deteriorating efficiency.

Figure 5:
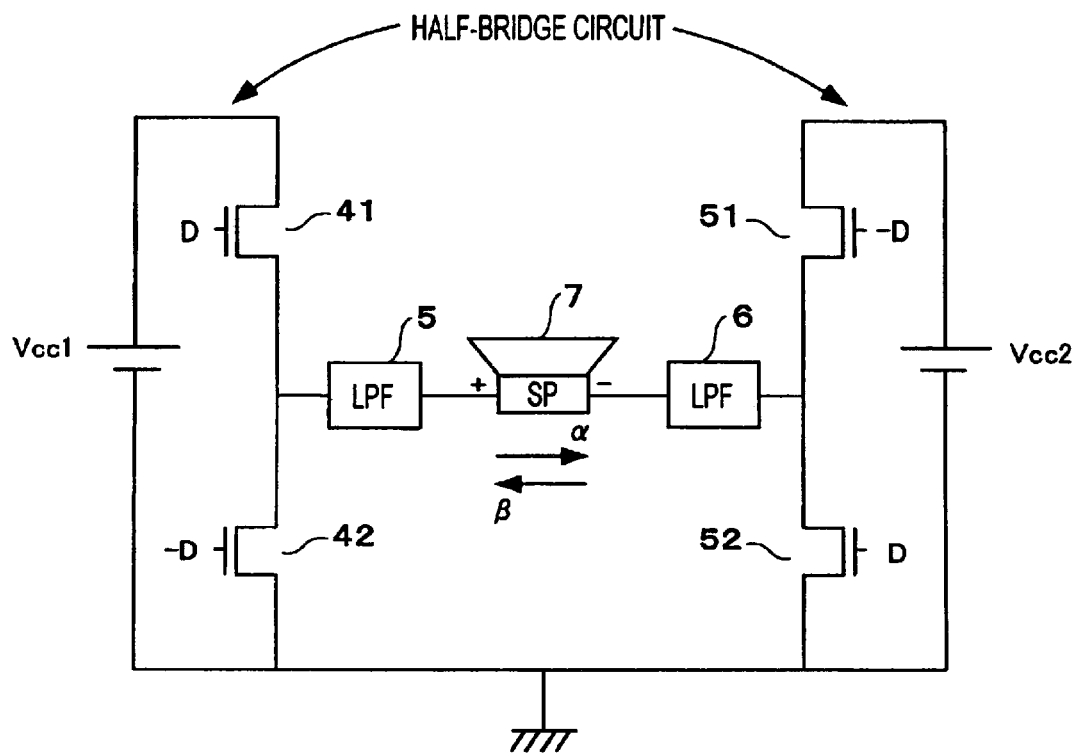
FIG. 5 is a circuitry diagram of an output stage of a pulse width modulation amplifier relating to another embodiment of the present invention.
Figure 6:
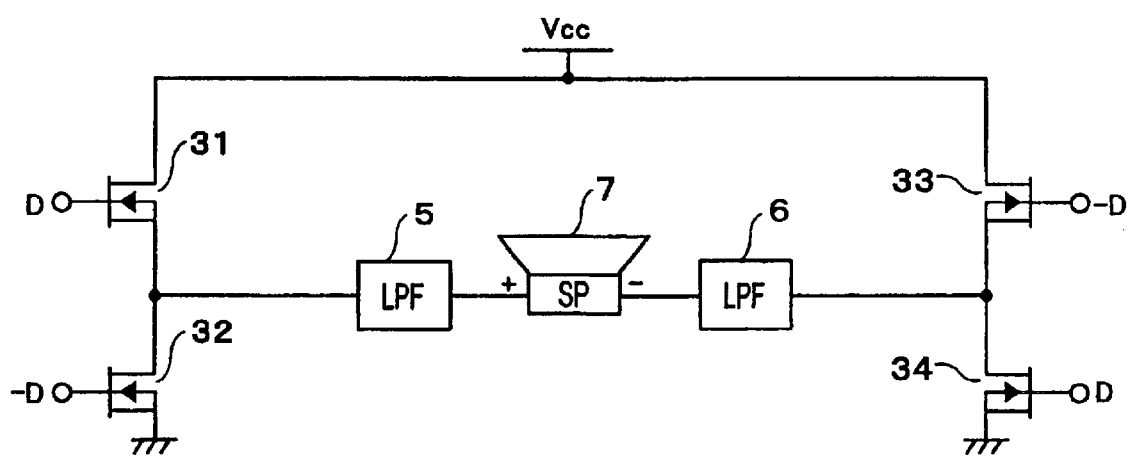
FIG. 6 is a block diagram showing an output stage of a conventional pulse width modulation amplifier.
Figure 7:
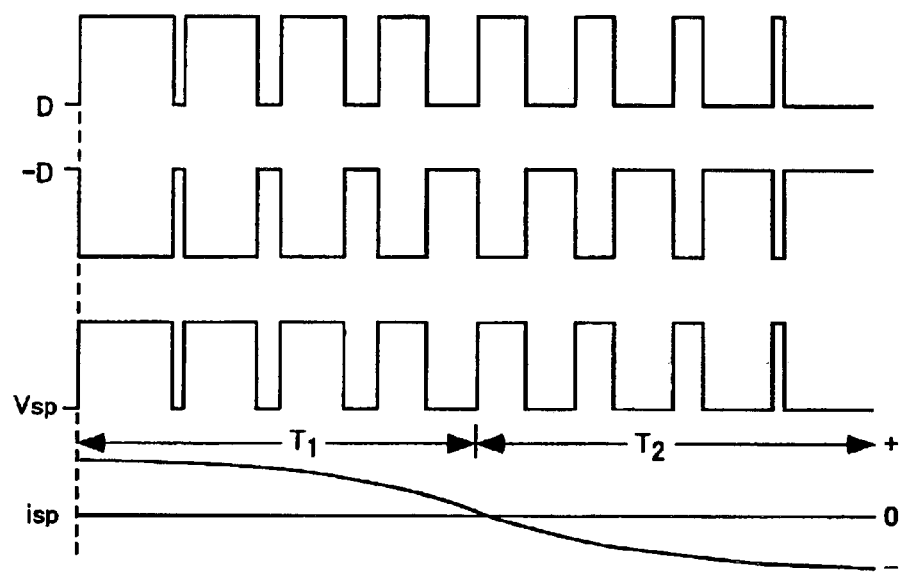
FIG. 7 is a waveform chart showing operations of each part of the pulse width modulation amplifier according to earlier development.

In the description above, two full-bridge circuits are employed in the output stage 26. As shown in FIG. 5, however, it is possible to configure the output stage 26 with the first half-bridge circuit where a series circuit of two switching elements 41, 42 is connected to the first direct-current power source Vcc1, and the second half-bridge circuit where a series circuit of two switching elements 51, 52 is connected to the second direct-current power source Vcc2. When the output stage is configured with the two half-bridge circuits in such a manner as described above, the driving signal generating section 25 is not provided. Instead, the driving signal D being one of the two types of driving signals D, –D, which have been generated by the PWM generating section 23, switches on and off the switching element 41 in the positive pole side of the first direct-current power source Vcc1 of the first half-bridge circuit and the switching element 52 in the negative pole side of the second direct-current power source Vcc2 of the second half-bridge circuit. The other driving signal –D switches on and off the switching element 42 in the negative pole side of the first direct-current power source Vcc1 of the first half-bridge circuit and the switching element 51 in the positive pole side of the second direct-current power source Vcc2 of the second half-bridge circuit. In such an output stage as described above, as far as the audio data inputted into the input section 21 is a small signal, a ratio between the period when the driving signal D becomes level "H", and the period when the driving signal –D becomes level "H" is approximately 50:50, and then the power source is supplied alternately from the first direct-current power source Vcc1 and the second direct-current power source Vcc2, generating a similar advantage as described above.

In the embodiments above, a configuration where two sets of direct-current power sources and bridge circuits (full-bridge circuits or half-bridge circuits) are employed is described as a way of example. However, the present invention may also be applicable to the case where at least three sets of the direct-current power sources and bridge circuits (full-bridge circuits or half-bridge circuits) are employed.

What is claimed is:

1. A pulse width modulation amplifier which supplies to a load circuit an amplified output having been subjected to a pulse width modulation, comprising:

a first series circuit including a first switching element connected to a positive pole side of a first direct-current power source, and a second switching element, one end of said load circuit being connected to a connecting point between said first switching element and said second switching element, a second series circuit including a third switching element connected to a positive pole side of a second direct-current power source, and a fourth switching element, the other end of said load circuit being connected to a connecting point between said third switching element and said fourth switching element, and a driving circuit which turns on a set of said first switching element and said fourth switching element, and a set of said second switching element and said third switching element, set-by-set, each of said sets being alternately put into on-state.

2. A pulse width modulation amplifier which supplies to a load circuit an amplified output having been subjected to a pulse width modulation, comprising:

a first bridge circuit having a series circuit connecting a first switching element and a second switching element, and a series circuit connecting a third switching element being connected to said first switching element, and a fourth switching element, a connecting point between said first and said third switching element being connected to a first direct-current power source, and a connecting point between said first and said second switching elements being connected to a connecting point between said third and said fourth switching elements by way of said load circuit, a second bridge circuit having a series circuit connecting a fifth switching element and a sixth switching element, and a series circuit connecting a seventh switching element being connected to said fifth switching element, and an eighth switching element, a connecting point between said fifth and said seventh switching elements being connected to a second direct-current power source, and a connecting point between said fifth and said sixth switching elements being connected to a connecting point between said seventh and said eighth switching element by way of said load circuit, and a driving circuit which turns on a first set of said first and fourth switching elements, a second set of said second and third switching elements, a third set of said fifth and eighth switching elements and a fourth set of said sixth and seventh switching elements set-by-set, so that said first set and said third set are alternately turned on, and when said first set and said third set are not in on-state, said second set and said fourth set are alternately turned on.

* * * * *